(12) United States Patent
Seo et al.

(10) Patent No.: US 12,179,464 B2
(45) Date of Patent: Dec. 31, 2024

(54) METHOD FOR MANUFACTURING ULTRA-THIN GLASS, ULTRA-THIN GLASS, AND DISPLAY DEVICE INCLUDING THE ULTRA-THIN GLASS

(71) Applicant: LG Display Co., Ltd., Seoul (KR)

(72) Inventors: Doowon Seo, Paju-si (KR); Wooseok Roh, Paju-si (KR); Moongoo Kim, Paju-si (KR); Chan Park, Paju-si (KR); Eungchul Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 17/843,783

(22) Filed: Jun. 17, 2022

(65) Prior Publication Data

US 2022/0402235 A1 Dec. 22, 2022

(30) Foreign Application Priority Data

Jun. 18, 2021 (KR) .................. 10-2021-0079257

(51) Int. Cl.
| | |
|---|---|
| *B32B 17/06* | (2006.01) |
| *B32B 3/30* | (2006.01) |
| *B32B 37/16* | (2006.01) |
| *B32B 38/10* | (2006.01) |
| *C03C 15/00* | (2006.01) |
| *C03C 17/00* | (2006.01) |
| *G02F 1/1333* | (2006.01) |
| *H10K 50/84* | (2023.01) |
| *H01L 25/16* | (2023.01) |
| *H10K 59/12* | (2023.01) |

(52) U.S. Cl.
CPC ............ *B32B 3/30* (2013.01); *B32B 17/06* (2013.01); *B32B 37/16* (2013.01); *B32B 38/10* (2013.01); *C03C 15/00* (2013.01); *C03C 17/002* (2013.01); *G02F 1/133331* (2021.01); *H10K 50/841* (2023.02); *B32B 2315/08* (2013.01); *B32B 2457/20* (2013.01); *C03C 2217/78* (2013.01); *C03C 2218/11* (2013.01); *H01L 25/167* (2013.01); *H10K 59/12* (2023.02)

(58) Field of Classification Search
None
See application file for complete search history.

(56) References Cited

U.S. PATENT DOCUMENTS

| | | | | |
|---|---|---|---|---|
| 8,409,771 | B2 * | 4/2013 | Ku | G03F 1/48 430/5 |
| 10,459,271 | B2 * | 10/2019 | Guo | G03F 7/40 |
| 11,101,454 | B2 * | 8/2021 | Jung | H10K 59/873 |

(Continued)

FOREIGN PATENT DOCUMENTS

| | | | | |
|---|---|---|---|---|
| EP | 3592500 | B1 * | 10/2023 | ......... B23K 26/0006 |
| KR | 10-2020-0060655 | A | 6/2020 | |

*Primary Examiner* — Jodi C Franklin

(74) *Attorney, Agent, or Firm* — Seed IP Law Group LLP

(57) ABSTRACT

Disclosed is a method for manufacturing ultra-thin glass. The method includes: patterning, on a mother glass substrate comprising a plurality of display cells and a dummy area surrounding the display cells, a cutting line having a shape corresponding to the display cells; forming a mother glass protective film on the mother glass substrate; forming a through-hole which corresponds to the cutting line by etching the mother glass substrate; and cutting bridges which are formed by the mother glass substrate and connect the through-holes.

5 Claims, 11 Drawing Sheets

(56) References Cited

U.S. PATENT DOCUMENTS

| | | | | |
|---|---|---|---|---|
| 11,161,335 | B2* | 11/2021 | Jung | G06F 1/1609 |
| 2007/0158656 | A1* | 7/2007 | Lee | H01L 27/1288 |
| | | | | 438/149 |
| 2008/0220151 | A1* | 9/2008 | Kataoka | H10K 50/8426 |
| | | | | 427/66 |
| 2012/0009702 | A1* | 1/2012 | Cho | H10K 71/00 |
| | | | | 438/26 |
| 2012/0135195 | A1* | 5/2012 | Glaesemann | B23K 26/0624 |
| | | | | 428/156 |
| 2013/0303053 | A1* | 11/2013 | Mase | B24C 1/04 |
| | | | | 451/31 |
| 2014/0132856 | A1* | 5/2014 | Hung | C03C 25/10 |
| | | | | 428/161 |
| 2014/0147624 | A1* | 5/2014 | Streltsov | B23K 26/361 |
| | | | | 65/30.14 |
| 2014/0167004 | A1* | 6/2014 | Jeong | H10K 50/8426 |
| | | | | 438/33 |
| 2017/0084883 | A1* | 3/2017 | Kwon | H10K 77/111 |
| 2018/0029933 | A1* | 2/2018 | Na Zou | C03C 15/00 |
| 2018/0178493 | A1* | 6/2018 | Fujioka | B32B 15/043 |
| 2020/0168849 | A1* | 5/2020 | Jung | H10K 59/131 |
| 2020/0391498 | A1* | 12/2020 | Jung | G02B 1/14 |

* cited by examiner

METHOD FOR MANUFACTURING ULTRA-THIN GLASS, ULTRA-THIN GLASS, AND DISPLAY DEVICE INCLUDING THE ULTRA-THIN GLASS

CROSS-REFERENCE TO RELATED APPLICATIONS

The present application claims priority to Patent Application No. 10-2021-0079257, filed on 18, Jun. 2021, the entire contents of which is incorporated herein for all purposes by this reference.

BACKGROUND

Technical Field

The present disclosure relates to a method for manufacturing ultra-thin glass, the ultra-thin glass manufactured by the method, and a display device including the ultra-thin glass.

Description of the Related Art

With the development of the information society, the demand for display devices is also increasing in various forms. In response to this, a flat panel display device to which various display panels are applied, such as an organic light-emitting diode (OLED), Liquid Crystal Display (LCD), Quantum Dot Display (QD Display), Electro Luminescent Display (ELD), and Vacuum Fluorescent Display (VFD), is being developed.

Recently, as the display panel manufacturing process is advanced, a flexible display panel is actively becoming thinner and lighter and a display device including the same is being actively commercialized. Accordingly, research is being conducted to easily manufacture ultra-thin glass.

BRIEF SUMMARY

The purpose of the present disclosure is to teach a method for manufacturing ultra-thin glass. Specifically, the embodiments of the present disclosure teach the method for manufacturing ultra-thin glass, which includes a simplified five-step process including patterning a cutting line, forming a mother glass protective film, etching, scribing, and strengthening.

The embodiments provide ultra-thin glass. Specifically, the embodiments provide ultra-thin glass having at least one bridge, wherein the ultra-thin glass includes a body that has a shape corresponding to display cells and the at least one bridge which protrudes from the body.

The embodiments provide a display device including the ultra-thin glass. Specifically, a lower substrate; a thin film transistor (TFT) layer disposed on the lower substrate; a light-emitting device layer disposed on the TFT layer; and the ultra-thin glass disposed on the light-emitting device layer. One embodiment is a method for manufacturing ultra-thin glass. The method may include: patterning, on a mother glass substrate comprising a plurality of display cells and a dummy area surrounding the display cells, a cutting line having a shape corresponding to the display cells; forming a mother glass protective film on the mother glass substrate; forming a through-hole which corresponds to the cutting line by etching the mother glass substrate; and cutting at least one bridge which is formed by the mother glass substrate and connects the through-holes.

The mother glass protective film may be formed to comprise an edge of the mother glass substrate by laminating an acid-resistant film or by coating or depositing the acid-resistant solution in at least a portion of the dummy area.

The mother glass protective film may be formed of a material that does not react to an etching solution used in the etching process.

The cutting line may have a closed-loop shape surrounding the display cell and may include a plurality of patterns arranged in the closed-loop shape and spaced apart from each other.

The cutting line may be formed by irradiating a laser to the mother glass substrate.

An area where the mother glass protective film is not formed may be eroded by the etching of the mother glass substrate and have a first thickness, and an area where the mother glass protective film is formed may not be eroded and have a second thickness larger than the first thickness.

The first thickness may be about 30 um, and the second thickness may be about 150 um to 180 mm.

The first thickness may be about 20 um to 100 um, and the second thickness may be about 70 um to 1.3 mm.

Through-holes corresponding to the plurality of patterns and the at least one bridge connecting the through-holes may be formed by the etching of the mother glass substrate.

As the connection of the display cell to the mother glass by the at least one bridge is cut, the display cells may be separated from the mother glass substrate, respectively.

The method for manufacturing ultra-thin glass may further include strengthening the mother glass substrate after the etching of the mother glass substrate.

The ultra-thin glass in which at least one bridge is formed may include a body having a shape corresponding to display cells, and at least one bridge protruding from the body.

The at least one bridge may be formed to protrude from at least one of an upper side, a lower side, a left side, and a right side of the body.

The at least one bridge may be formed on the upper and lower sides of the body respectively. The area of the bridge formed on the upper side of the body may be different from the area of the bridge formed on the lower side of the body.

The at least one bridge may be formed on the upper and lower sides of the body respectively. The number of the bridge formed on the upper side of the body may be different from the number of the bridge formed on the lower side of the body.

The ultra-thin glass may further include a protective film that is adhered to at least one of an upper surface and a lower surface of the ultra-thin glass.

The protective film may be formed to have a larger area than those of the body and the bridge.

The at least one bridge may have a trapezoidal shape of which the length of one side is different from the length of the other side.

The length of one side may be greater than or equal to 3 um, and the length of the other side may be greater than or equal to 15 um.

The cross-section of the at least one bridge is formed to have a predetermined angle.

The cross-section of the body has a wedge shape having a first angle and a second angle, and the first angle and the second angle are the same as or different from each other.

Another embodiment is a display device including: a lower substrate; a TFT layer disposed on the lower substrate; a light-emitting device layer disposed on the TFT layer; and an ultra-thin glass disposed on the light-emitting device layer. The ultra-thin glass may include: a body having a shape corresponding to display cells; and at least one bridge protruding from the body. The at least one bridge may protrude from at least one of an upper side, a lower side, a left side, and a right side of the body.

The at least one bridge may be formed on the upper and lower sides of the body respectively, the number of the at least one bridge formed on the upper side of the body may be different from the number of the at least one bridge formed on the lower side of the body.

The display device may further include a protective film that is adhered to at least one of an upper surface and a lower surface of the ultra-thin glass. The protective film may be formed to have a larger area than those of the body and the at least one bridge of the body.

The at least one bridge has a trapezoidal shape. The height of the trapezoidal shape may be greater than or equal to 3 um, and the length of one side of the trapezoidal shape may be greater than or equal to 15 um.

The cross-section of the at least one bridge may be formed to have a predetermined angle. The cross-section of the body may have a wedge shape having a first angle and a second angle, and the first angle and the second angle may be the same as or different from each other. The method for manufacturing the ultra-thin glass according to the embodiments simplifies the process to increase the process yield and reduce the manufacturing cost.

In addition, the method for manufacturing the ultra-thin glass according to the embodiments creates a glass pillar structure, thereby preventing the thinned mother glass substrate from being damaged after being etched.

In addition, the method for manufacturing the ultra-thin glass according to the embodiments may etch the mother glass substrate through a dotted-lined cutting pattern and then may prevent the display cells from being naturally separated.

Since the ultra-thin glass according to the embodiments includes a body and at least one bridge protruding from the body, the bridge may serve as a handle for moving the ultra-thin glass.

Since the ultra-thin glass according to the embodiments includes at least one bridge, the bridge can strengthen adhesion to a protective film that is adhered to at least one of the upper and lower surfaces of the ultra-thin glass.

In the ultra-thin glass according to the embodiments, the area or number of one or more bridges are caused to be different, so that this can be used as information specifying a date of manufacture and a place of manufacture of the ultra-thin glass.

The display device according to the embodiments may include ultra-thin glass having a thickness of 30 μm and ensuring rigidity.

The display device according to the embodiments may include ultra-thin glass which has a thickness of 20 μm to 100 μm and is applied to a foldable or rollable display device.

DETAILED DESCRIPTION

Figure 1:
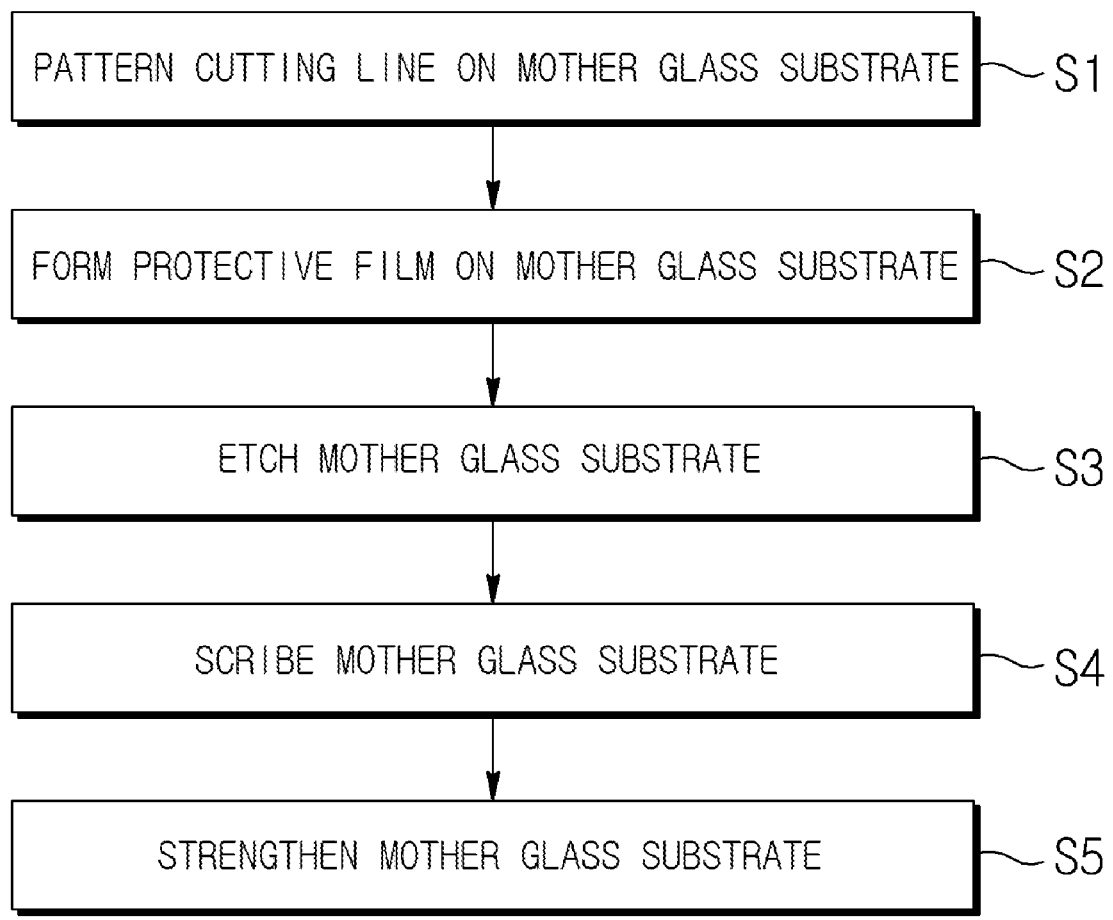
FIG. 1 is a flowchart showing schematically a method for manufacturing ultra-thin glass according to an embodiment of the present disclosure.

Hereinafter, embodiments of the present disclosure will be described with reference to the accompanying drawings. When describing with reference to the drawings, the same or corresponding elements will be denoted by the same reference numerals irrespective of drawing numbers, and repetitive descriptions thereof will be omitted.

In the following embodiments, terms such as the first, the second, etc., are non-limiting and are used only for distinguishing between one component and other components. An expression of a singular form includes the expression of plural form thereof unless otherwise explicitly mentioned in the context. The term "include" or "comprise" and the like is intended to specify characteristics or components which are mentioned in the specification, and intended not to previously exclude the possibility of addition of at least one another characteristics or components.

In the following embodiments, when it is mentioned that a film, an area, a component, etc., are connected, it includes not only a case where they are directly connected but also a case where they are indirectly connected with another film, area, and component interposed therebetween. Also, when it is mentioned that parts of a film, an area, a component, etc., are on or above another part, it includes not only a case where they are directly on or above the above-described another part, but also a case where another film, area, component, etc., is interposed therebetween.

In a case where a certain embodiment can be embodied in various other ways, a specific process sequence may be performed differently from a described sequence. For example, two processes described in succession may be substantially performed at the same time or may be performed in reverse sequence to the described sequence.

In the drawings, for convenience of description, the size of components may be enlarged or reduced for ease of illustrating some features. For example, the size and thickness of each component shown in the drawings may be selected for convenience of description, and the present invention is not necessarily limited to the relative sizes and location of features as shown.

FIG. 1 is a flowchart showing schematically a method for manufacturing ultra-thin glass according to an embodiment of the present disclosure. FIGS. 2 to 7 show schematically the method for manufacturing the ultra-thin glass according to the embodiment of the present disclosure. FIGS. 8 to 11 show the shape of the ultra-thin glass after being etched according to the embodiment.

Figure 2:
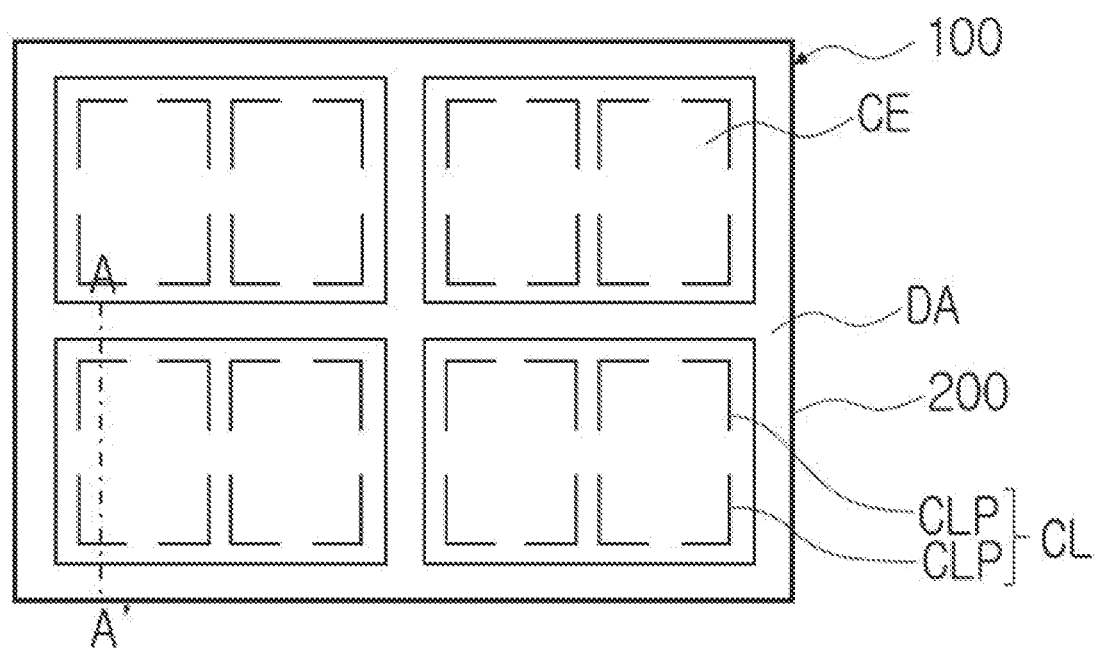
FIGS. 2 to 7 show schematically the method for manufacturing the ultra-thin glass according to the embodiment of the present disclosure.
Figure 3:
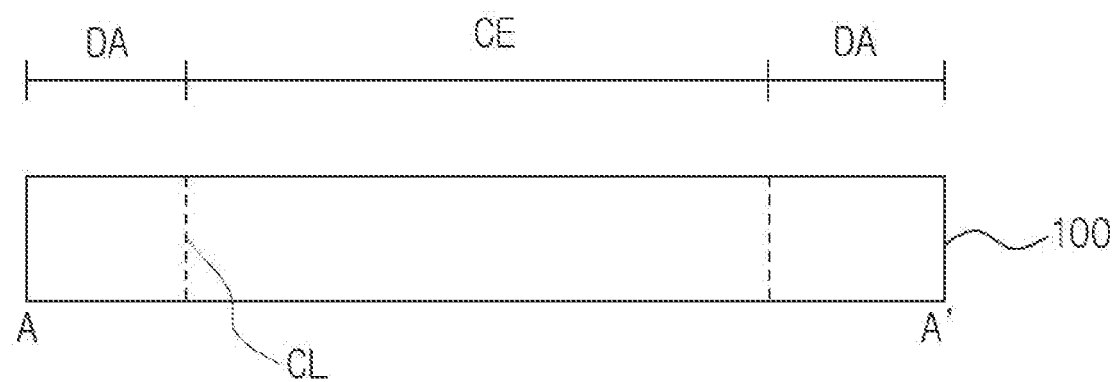
Figure 4:
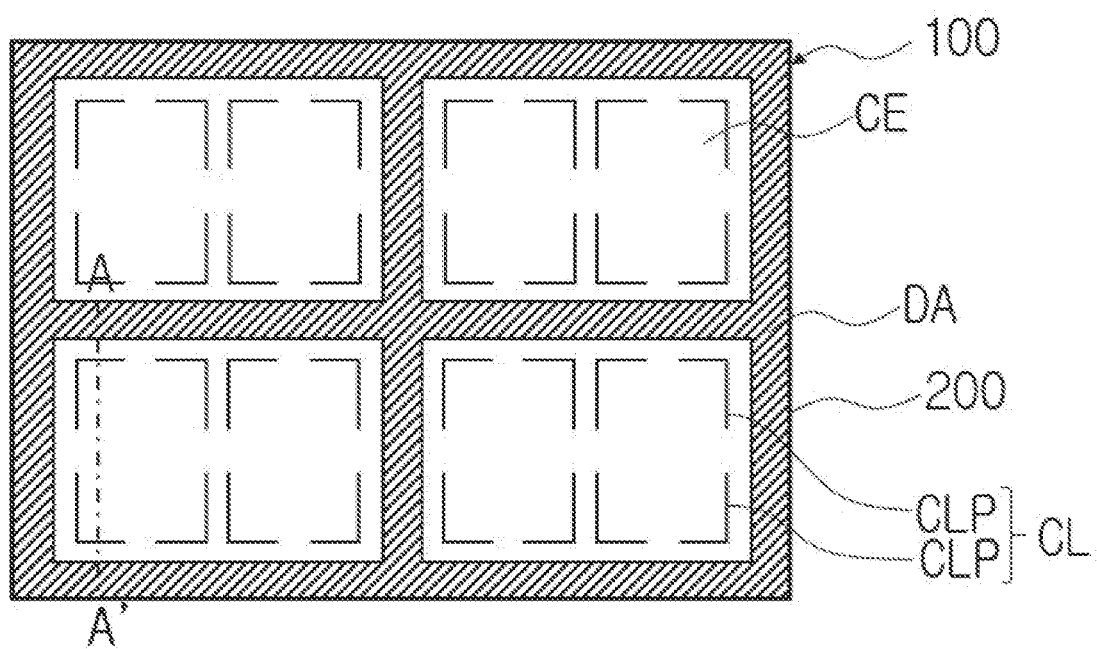
Figure 5:
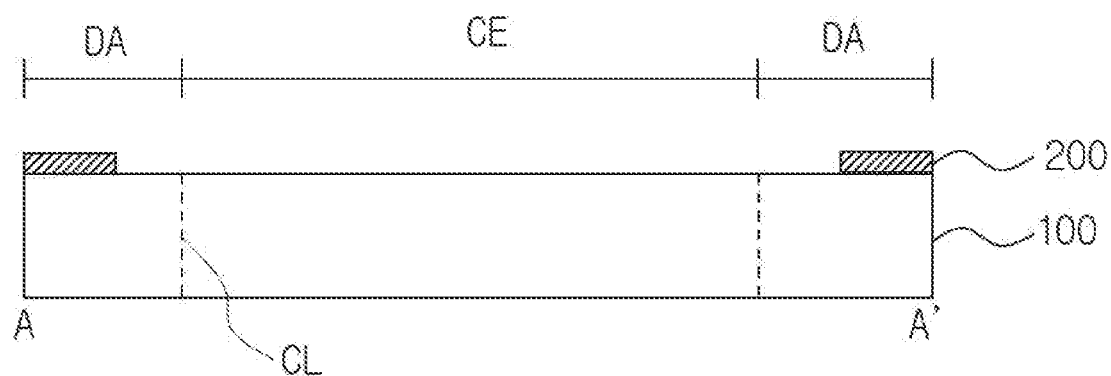
Figure 6:
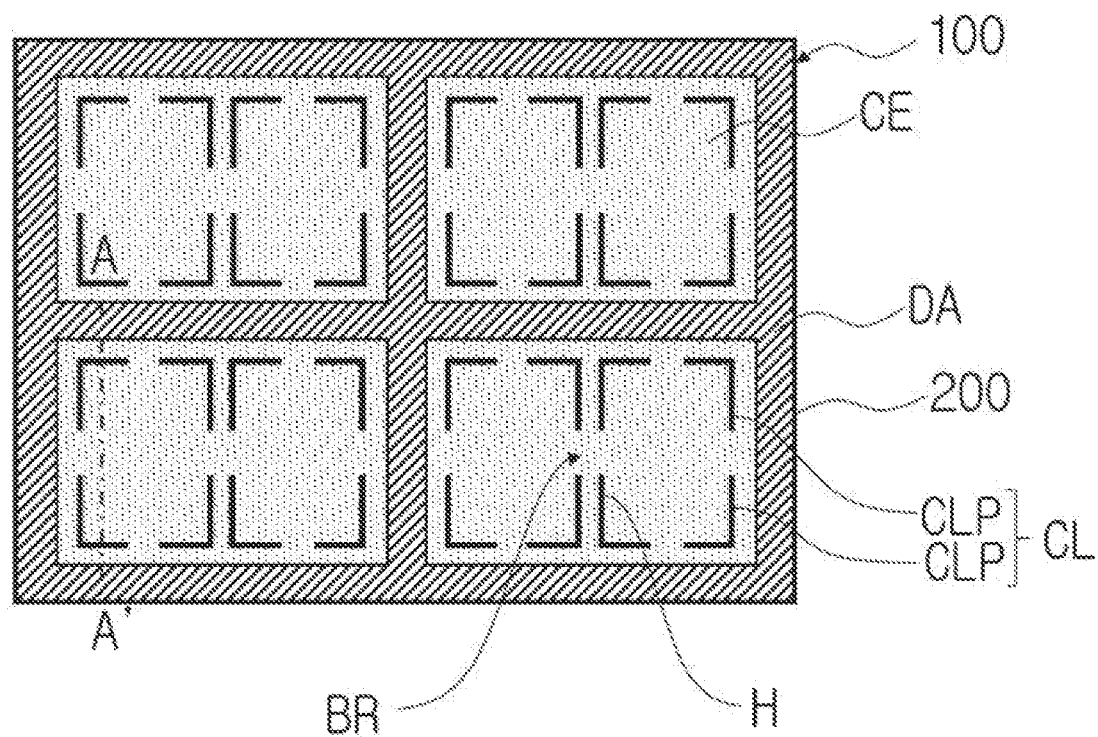
Figure 7:
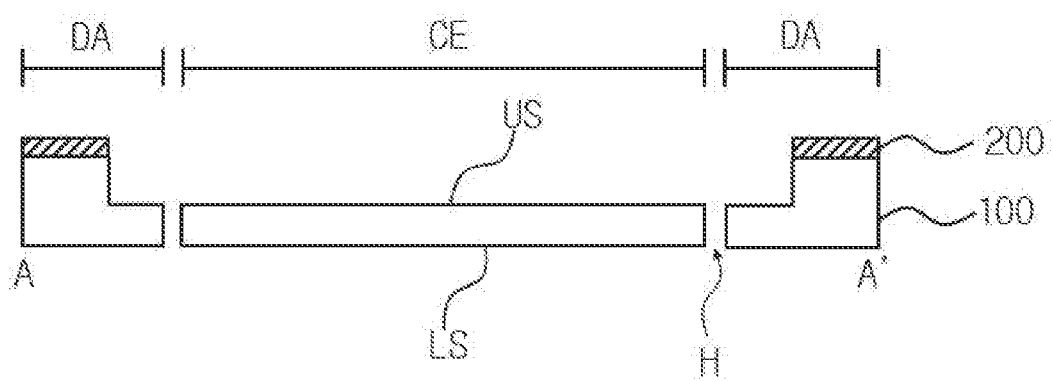
Figure 8:
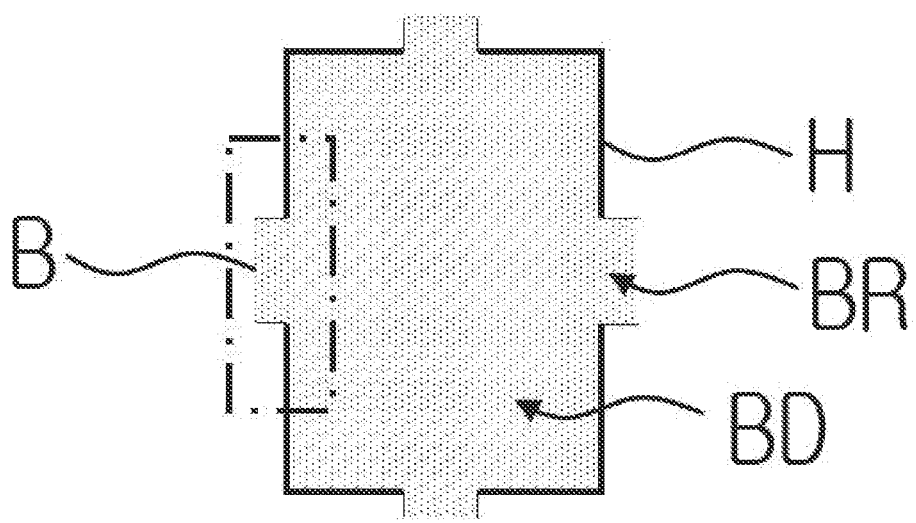
FIGS. 8 to 11 show the shape of the ultra-thin glass according to the embodiment.
Figure 9:
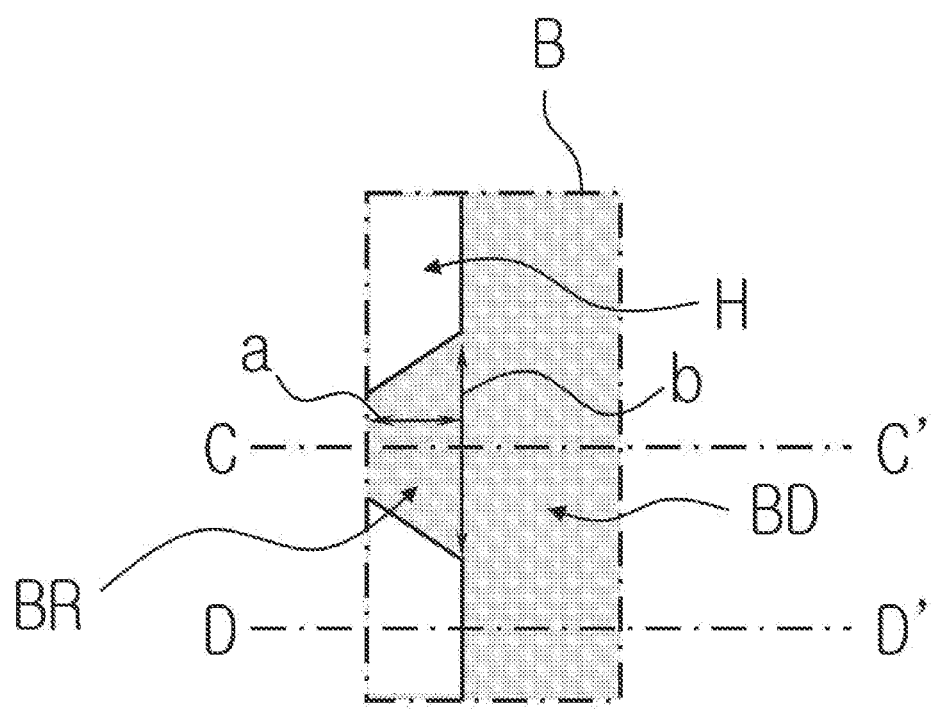
Figure 10:
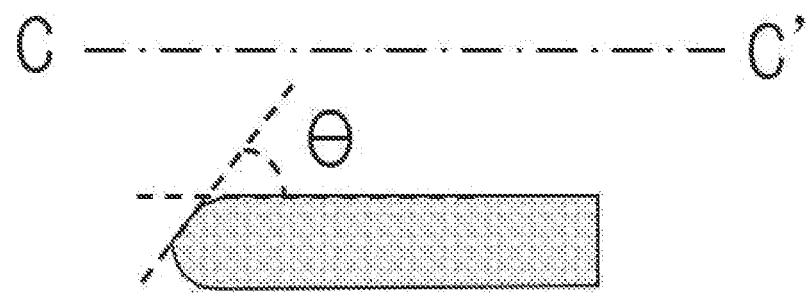
Figure 11:
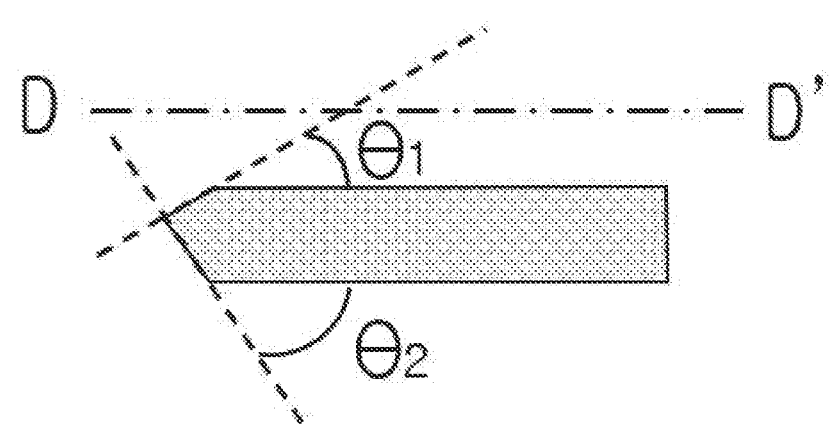

Specifically, FIGS. 2, 4, 6, and 8 are plan views showing schematically the method for manufacturing the ultra-thin glass according to the embodiment. FIG. 2 is a plan view showing a mother glass substrate 100 on which a cutting line CL is patterned. FIG. 4 is a plan view showing a mother glass protective film 200 formed on the mother glass substrate 100. FIG. 6 is a plan view showing the etched mother glass substrate 100. FIG. 8 is a plan view showing a display cell CE separated for describing scribing the mother glass substrate 100. FIGS. 3, 5, and 7 are cross-sectional views taken along lines A-A' of FIGS. 1, 3, and 5. FIG. 9 is an enlarged plan view of an area "B" of FIG. 8. FIG. 10 is a cross-sectional view taken along line C-C' of FIG. 9. FIG. 11 is a cross-sectional view taken along line D-D' of FIG. 9.

Referring to FIG. 1, the method for manufacturing the ultra-thin glass according to the embodiment includes patterning a closed-root-shaped cutting line CL corresponding to the display cell CE on the mother glass substrate 100 (S1), forming the mother glass protective film 200 on the mother glass substrate 100 (S2), etching the mother glass substrate 100 to thin the mother glass substrate 100 and exfoliating the cutting line CL (S3), separating a dummy area and a plurality of the display cells by scribing a bridge of the cutting line CL (S4), and strengthening the mother glass substrate 100 (S5) with a treatment process.

First, referring to FIGS. 2 and 3, the cutting line CL is patterned on the mother glass substrate 100.

The mother glass substrate 100 may be made of glass. The glass material-made mother glass substrate 100 has higher rigidity than that of a substrate made of a plastic material. The mother glass substrate 100 can be used to form the display cells glass cover CE without use an additional support substrate, thereby simplifying a process including the attachment and detachment of the support substrate. In the embodiment, the starting thickness of the mother glass substrate 100 may be about 0.33 T (330 um).

The mother glass substrate 100 may include the glass for plurality of glass display cells CE and a dummy area DA surrounding the display cells CE. The glass substrate 100 is referred to herein as the "mother" glass substrate for ease of reference since it is the starting substrate that is larger than then any of the final glass display cells. The mother substrate 100 could alternatively be referred to as a starting glass substrate 100, a base substrate 100, or the like. A plurality of individual glass display cells CE are obtained from the cutting apart of the mother glass starting substrate. (These might be considered "child" glass substrates that are obtained when they are etched apart from the mother glass.) FIG. 2 shows eight individual glass display cells CE that can be obtained from one mother glass substrate 100. As can be appreciated, for a large mother glass substrate, it might be possible to obtain a dozen, several dozen or over a hundred individual glass display cells CE. The number of individual glass display cells CE obtained will also depend on the relative size of each cell CE. If the individual glass display cell CE is for a basic smart phone, it will be relatively small. If it is for a smart watch, it will be even smaller and many glass display cells CE can be obtained from one mother substrate 100. If it is for notepad sized computer, then fewer will be obtained for the same size starting mother substrate 100.

The display cell CE is a minimum unit that can be individually separated and used on a display panel after a scribing process. In the following embodiments, ultra-thin glass is described as being manufactured for a cover glass of the display panel, and the mother glass substrate 100 is described as including one or more display cells CE. However, the present embodiment is not limited thereto, and the ultra-thin glass can be used in various fields, and the mother glass substrate 100 may be configured to obtain a cell as the smallest unit for a target product. The target product could be a smart watch, a smart phone, a notepad, a notebook, a computer display, a TV display or any other product that provides a display for a user.

In the embodiment, the display cell CE has a rectangular shape. However, the present embodiment is not limited thereto, and the display cell CE may have various shapes such as a rectangle, a circle, an ellipse, and a polygon.

The dummy area DA may be disposed to surround the display cells CE and may be separated from the display cells CE after the scribing process.

Referring back to FIGS. 2 and 3, the cutting line CL is patterned on the mother glass substrate 100.

The cutting line CL may be formed in a closed-loop shape surrounding each display cell CE. For example, the cutting line CL may include a plurality of patterns CLP arranged in an "L" shape, a closed-loop shape, or other selected shape and spaced apart from each other. In the shown embodiment, the plurality of patterns CLP may be arranged in a rectangular shape and be formed to be spaced apart from each other on each side of the rectangle. However, the present embodiment is not limited to what is shown, and a larger or smaller number of patterns CLP may be arranged in various shapes and at various intervals.

In the embodiment, the cutting line CL may be formed by irradiating a laser to the mother glass substrate 100. When a laser is irradiated to the mother glass substrate 100, a glass material may be processed by laser energy and then a pattern may be formed. A processed area may be etched faster than an unprocessed area in an etching step to be described later, and as a result, only the cutting line CL can be selectively eroded through the etching.

Referring to FIGS. 4 and 5, the protective film 200 is formed on the mother glass substrate 100.

The mother glass protective film 200 is formed in at least one area of the dummy area DA. For example, the mother glass protective film 200 may be formed in the dummy area DA in such a way as to include the edge of the mother glass substrate 100 and to surround the one or more display cells CE. The mother glass protective film 200 may be formed of a material that does not react to an etching solution used in the etching process to be described later, so that it is possible to protect at least a portion of the dummy area DA from erosion during the etching process. The mother glass protective film 200 may be formed by laminating an acid-resistant film or may be formed by coating or depositing an acid-resistant solution.

For another example, the mother glass protective film 200 may be formed of a tape that does not react to an etching solution. The mother glass substrate 100 on which the cutting line CL is formed may be fixed to a plate (not shown) in order to facilitate the etching process to be described later. The plate may be made of, for example, a metal material and may have a rectangular shape having an area larger than that of the mother glass substrate 100. In some cases, the plate may have its filled interior, and when the mother glass substrate 100 is attached to one side of the plate by using a tape, one side of the mother glass substrate 100 on which the etching process is performed may be etched. In some cases, the plate may have a closed-loop shape with the interior removed, and when the mother glass substrate 100 is attached to one side of the plate by using a tape, both sides of the mother glass substrate 100 on which the etching process is performed are exposed, so that said both sides may be etched. Hereinafter, double-sided etching will be described as an example, and the same technical spirit can be applied to single-sided etching.

Referring to FIGS. 6 and 7, the mother glass substrate 100 is etched. The etching process may be performed, for example, by applying an etching solution to the surface of the mother glass substrate 100. The etching solution is a material capable of etching a glass material based on SiO2 as a main component, and may include at least one of sulfuric acid ($H_2SO_4$), hydrofluoric acid (HF), hydrochloric acid (HCl), and nitric acid ($HNO_3$). The etching is preferably an anisotropic vertical etch that will result in a uniform thickness of the etched glass in all places exposed to the etch. The sidewalls of the glass substrate covered by film 200 are generally vertical due to the anisotropic nature of the etch. In the embodiment, when single-sided etching is performed, the etching solution may be applied to a side on which the protective film 200 has been formed, among both sides of the mother glass substrate 100, so that the thickness of the applied side can be reduced. In another embodiment, when double-sided etching is performed, the etching solution is applied to not only the upper surface (the surface on which the protective film 200 has been formed) but also the lower surface (the surface on which the protective film 200 has not been formed) of the mother glass substrate 100, so that it is possible to reduce the total thickness of the mother glass substrate 100.

Through the etching process, the upper and lower surfaces of the mother glass substrate 100 are eroded and the thickness of the mother glass substrate is reduced. In the embodiment, the thickness of the etched mother glass substrate 100 may be about 0.03 T (30 um). In another embodiment, the thickness of the etched mother glass substrate 100 may be about 0.02 T (20 um) to about 0.1 T (100 um). Such thicknesses may be the thickness of an ultra-thin glass that is applied to a foldable or rollable display device.

During the etching process, a portion of the upper surface of the dummy area DA on which the mother glass protective film 200 has been formed is not eroded. Accordingly, after the etching process, a portion of the dummy area DA on which the mother glass protective film 200 has been formed has a greater thickness than that of an eroded surrounding area. In the embodiment, the thickness of the non-etched dummy area DA may be about 0.15 T (150 um) to about 0.18 T (180 um). In another embodiment, the thickness of the non-etched dummy area DA may be about 0.07 T (70 um) to 1.3 T (1.3 mm). Such thicknesses may be the thickness of an ultra-thin glass that is applied to a foldable or rollable display device.

As such, after the etching process, a glass pillar structure in which the height of the upper surface of the dummy area DA is higher than that of the surroundings may be implemented. The glass pillar structure may function to support the entire mother glass 200 and to prevent the breakage of the ultra-thin glass having a thickness of about 0.03 T (30 um) after the etching process.

The patterns CLP of the cutting line CL are eroded more strongly than the surrounding area, so that through-holes H passing through the mother glass substrate 100 along the cutting line CL may be formed. The through holes H can be formed by any acceptable method. In one embodiment, the patterns CLP are etched more rapidly than the unmarked glass so that the same etch process that is used to make the thinner glass also etches the through holes H in the same step. Alternatively, a separate mask and etch process can be used to etch holes H in all locations marked by CLP and not etch the mother glass 100 at any other location.

Bridges BR may be formed between the through-holes H that correspond to the spaced areas between the patterns CLP. Due to the bridge BR, the display cells CE remain connected to the dummy area DA without being completely separated from the mother glass substrate 100 after the etching process.

In the next steps, referring to FIGS. 8 and 9, the mother glass substrate 100 is scribed to separate each of the individual display cells CE from the mother glass substrate 100 into individual sheets. The scribing process may be performed by cutting the distal edge of the bridge BR through a laser, a wheel cutter, thermal chamfering, or the like. A portion of the bridge BR extends beyond the side of the display cell CE, as shown in FIG. 8. In the embodiment, for precisely cutting the bridge BR, an alignment mark (alignment key) for aligning scribing tools and the mother glass substrate 100 may be formed in the dummy area DA. Also, according to the embodiment, the bridge BR cutting may be performed at a time by overlapping a plurality of the mother glass substrates 100. However, the present embodiment is not limited thereto.

According to the embodiment, a process such as polishing or rounding the edges of the separated display cells CE may be further performed after the scribing process.

After the scribing process, a process of chemically strengthening the mother glass substrate 100 may be performed. The strengthening process may be performed through an ion-exchange method, or the like. For example, the strengthening process may be performed by treating the entire surface of the mother glass substrate 100 with a material including alkali ions, for example, potassium nitrate ($KNO_3$) or sodium nitrate ($NaNO_3$). In the embodiment, a cleaning process, etc., of removing foreign substances from the surface of the mother glass substrate 100 may be further performed before the strengthening process.

The separated display cells CE are glass made of an ultra-thin film with a thickness of about 30 μm, and may be used as a cover glass of various electronic devices including the display panel, such as a TV, a smart phone, a wearable device, and the like.

As described above, the method for manufacturing the ultra-thin glass according to the embodiment includes a simplified five-step process including forming the mother glass protective film, patterning the cutting line, etching, strengthening, and scribing. Accordingly, the method for manufacturing the ultra-thin glass can increase the process yield and reduce the manufacturing cost.

Meanwhile, referring to FIGS. 8 and 9, the display cells CE separated according to the embodiment are formed to include at least one bridge BR. This bridge will extend from the side of the body BD by a selected distance. Also, referring to FIGS. 10 and 11, cross-sections C-C' and D-D' of the display cells separated according to the embodiment are shown.

Specifically, the ultra-thin glass according to the embodiment may include a body BD having a shape corresponding to the display cells and at least one bridge BR protruding from the body BD.

Such a bridge BR may serve as a kind of handle to be used when moving the ultra-thin glass. Since the ultra-thin glass has a thickness of about 30 um and is very thin, special attention is required when moving the ultra-thin glass, otherwise, there is a risk of the ultra-thin glass being damaged. The bridge BR formed according to the embodiment serves as a handle to be touched and contacted when moving the ultra-thin glass that has a high risk of breakage, thereby providing convenience in moving the ultra-thin glass and reducing the risk of breakage occurring in moving the ultra-thin glass.

Also, as will be described later, the protective film for reinforcing the rigidity of the glass may be adhered to at least one of the upper and lower surfaces of the ultra-thin glass. The bridge BR according to the embodiment may be used as a handle for fixing the ultra-thin glass in forming the protective film. If the bridge BR according to the embodiment is not formed, the body BD should be contacted and fixed in the process of forming the protective film. In this case, there is a risk of damage to the body BD due to the contact, and there is a risk that foreign substances are attached to the body BD during the contact. However, the role of the bridge BR as a handle according to the embodiment can remove such a risk of breakage and the possibility of foreign substances being attached.

Also, the bridge BR may be formed to protrude from at least one of an upper side, a lower side, a left side, and a right side of the body BD. While FIGS. 8 and 9 exemplarily show that one bridge BR is formed on the upper side, the lower side, the left side, and the right side of the body BD, respectively, the embodiment is not limited thereto.

In addition, when the bridge BR is formed on the upper and lower sides of the body BD respectively, the area or number of the bridges BR may be different from each other. For example, the bridge BR having a relatively narrow area may be formed on the upper side of the body BD, and the bridge BR having a relatively large area may be formed on the lower side of the body BD, and vice versa. For another example, one bridge BR may be formed on the upper side of the body BD, and two or more bridges BR may be formed on the lower side of the body BD, and vice versa.

By varying the shape of the bridge BR in this way, this can be used as information specifying a date of manufacture and a place of manufacture of the ultra-thin glass. For example, depending on the date or time when the ultra-thin glass is manufactured or a processing line for the ultra-thin glass, the shape or number of the bridges is caused to be different from each other. As a result, it is possible to obtain such a value as information.

Also, according to the shape of the bridge BR, this can be used as information for distinguishing between the top and bottom of the ultra-thin glass. For example, a side on which one bridge BR is formed may be designated as an upper side, and a side on which two bridges BR are formed may be designated as a lower side. This top and bottom distinguishing information can be utilized for bonding the ultra-thin glass to the display panel after that.

The protective film may be adhered to at least one of the upper and lower surfaces of the ultra-thin glass according to the embodiment. The protective film is used to additionally secure the rigidity of the ultra-thin glass and may be formed of a material such as plastic or acrylic material. For example, as shown in FIG. 7, the protective film may be adhered to at least one of the upper surface US and the lower surface LS of the ultra-thin glass.

In this case, the protective film may be formed to have a larger area than those of the body BD and the bridge BR. That is, the protective film may have an area that covers the entire ultra-thin glass, and accordingly, the bridge BR may also be covered by the protective film. Accordingly, an adhesive force of the protective film may further increase. That is, since the area in contact with the protective film is further increased by the bridge BR, the adhesive force between the protective film and the ultra-thin glass can be further strengthened.

The bridge BR can have any selected shape, whether square, rectangle, oval, semi-circular or other. In one embodiment, at least one bridge BR may have a trapezoidal shape having a height "a" and a one side length "b". Specifically, in the at least one bridge BR, the height "a" protruding from the body BD may be greater than or equal to 3 Also, the one side length "b" of the at least one bridge BR may be greater than or equal to 15 For example, a ratio of the height "a" to the one side length "b" may be 1:5. As such, since the at least one bridge BD is formed in a trapezoidal shape, it is possible to increase the ease of handling the ultra-thin glass and to increase the adhesive force to the protective film.

FIG. 10 shows a cross-section C-C' of at least one bridge BD in the display cell separated according to the embodiment, and FIG. 11 shows a cross-section D-D' of the body BD in the display cell separated according to the embodiment.

Specifically, referring to FIG. 10, the cross-section of an outside edge or a sidewall of at least one bridge BD may have a predetermined angle θ. For example, the predetermined angle θ may be about 50 degrees to 130 degrees. For example, the predetermined angle θ may be formed by adjusting the angle of a cutting tool when cutting as described above. In the case of a laser as an example of the cutting tool, an irradiation angle of the laser is set to the predetermined angle and the laser is irradiated, so that the cross-section of the at least one bridge BD may be formed to have the angle predetermined angle θ. As in the present embodiment, the cross-section of the at least one bridge BD is formed to have the predetermined angle θ, so that it is possible to increase the lateral rigidity of the ultra-thin glass.

Also, referring to FIG. 11, the cross-section of the sidewall edge of body BD may be formed in a wedge shape. For example, the cross-section of the body BD may be formed to have a first angle θ1 and a second angle θ2, and the first angle θ1 and the second angle θ2 may be the same as or different from each other. When the first angle θ1 and the second angle θ2 are the same as each other, the cross-section of the body BD may be formed in a symmetrical wedge shape, and when the first angle θ1 and the second angle θ2 are different from each other, the cross-section of the body BD may be formed in an asymmetric wedge shape. The cross-sectional shape of the body BD may be formed by changing the type of etching solution sprayed onto the front and back sides of the mother glass substrate in the etching process described above. Alternatively, in the etching process described above, the cross-sectional shape of the body BD may be formed by varying the amount of the etching solution sprayed onto the front and back sides of the mother glass substrate. Alternatively, in the etching process described above, the cross-sectional shape of the body BD may be formed by varying the intensity with which the etching solution is sprayed onto the front and back sides of the mother glass substrate.

As such, by the thus formed cross-section of the sidewall of the body BD, the lateral rigidity of the ultra-thin glass can be increased and the adhesive force to the protective film can be increased.

Figure 12:
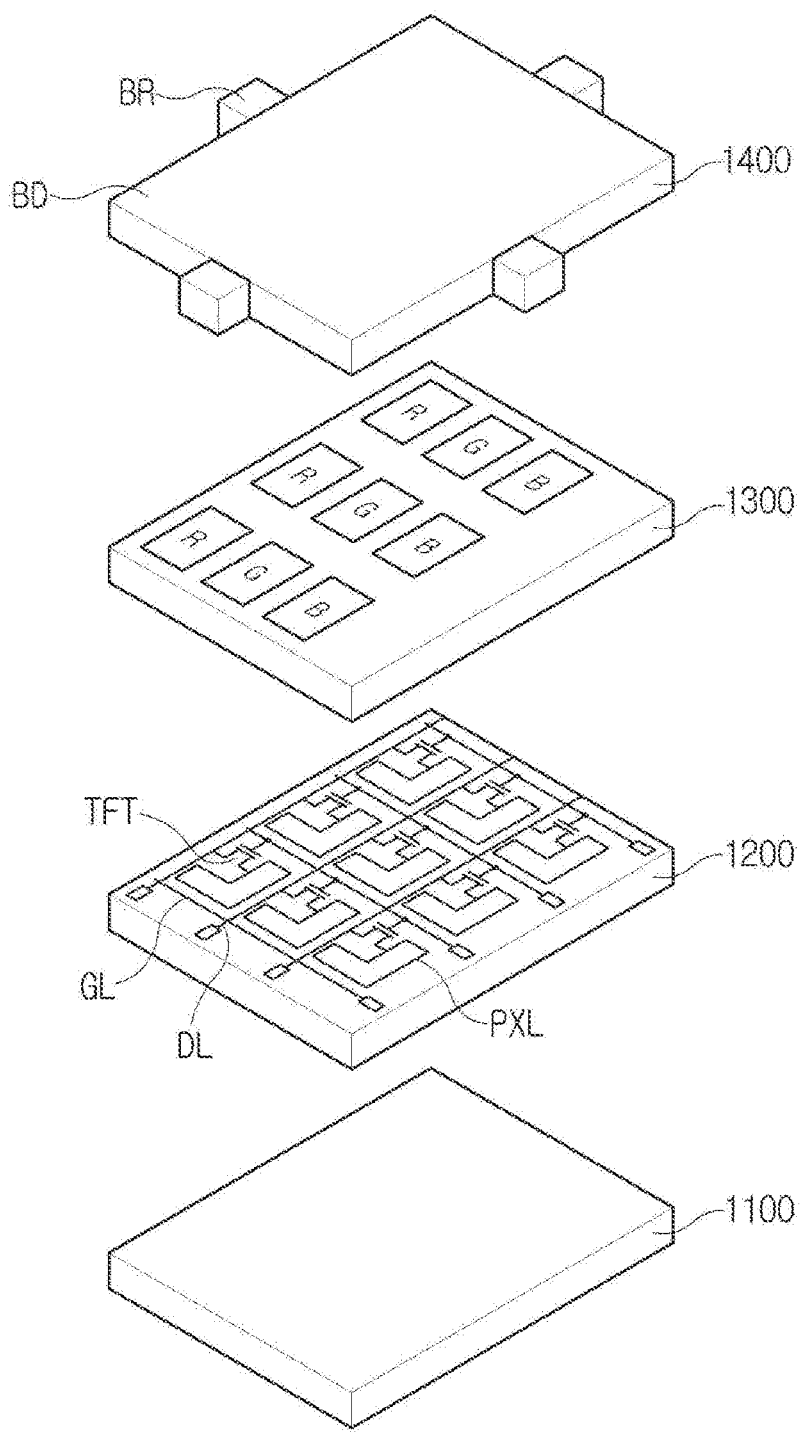
FIG. 12 shows exemplarily a display device including the ultra-thin glass formed according to the embodiment.

Referring to FIG. 12, a display device according to the embodiment is shown.

The display device according to the embodiment includes a lower substrate 1100, a TFT layer 1200, a light-emitting device layer 1300 disposed on the TFT layer 1200, and an ultra-thin glass 1400 disposed on the light-emitting device layer 1300.

The lower substrate 1100 serves as a base of the display device and supports elements positioned thereon. For example, the lower substrate 1100 may be formed of an insulating material having flexibility. The lower substrate 1100 includes a display area and a non-display area. The display area may be an area where a plurality of pixels is arranged, and the non-display area may be an area other than the display area. Wires and connection pads may be arranged in the non-display area.

The TFT layer 1200 is a layer where switching elements for controlling on/off of pixels are arranged. Active-matrix type switching elements may be arranged on the TFT layer 1200. A gate electrode pattern, a gate insulating layer, a semiconductor layer, an interlayer insulating layer, and source/drain electrode patterns may be disposed on the TFT layer 1200. Also, pixels PXL divided into a gate line GL, a data line DL, a gate line GL, and a data line DL may be formed.

The light-emitting device layer 1300 may include, for example, at least one of a liquid crystal layer, an organic light-emitting device layer, and a micro-LED layer. The liquid crystal layer is a layer in which the direction of the liquid crystal is changed by an electric field. The liquid crystal layer controls the amount of light emitted from a backlight unit disposed there below. The organic light-emitting device layer includes the organic light-emitting device and self-emits light according to the amount of current flowing through the organic light-emitting device. The micro-LED layer is a layer in which a plurality of micro-LEDs is arranged, and each micro-LED emits light to form an image. Light-emitting devices R, G, and B corresponding to red, green, and blue may be formed in the light-emitting device layer.

The ultra-thin glass 1400 is produced according to the manufacturing method described above and includes the body BD having a shape corresponding to the display cells and at least one bridge BR protruding from the body BD. Specifically, the at least one bridge BR may be formed to protrude from at least one of the upper side, the lower side, the left side, and the right side of the body BD. The bridge BR may serve as a handle for moving the ultra-thin glass, and may strengthen adhesion to the protective film that is adhered to at least one of the upper and lower surfaces of the ultra-thin glass. The area or number of the formed bridges are caused to be different, so that the bridge BR can be used as information specifying a date of manufacture and a place of manufacture of the ultra-thin glass. For example, there can be two or three bridges at top side, one of no bridges on a left side, or other pattern of bridges that will uniquely identify the product to which the body BD is to be applies. Also, at least one bridge may have a trapezoidal shape of which the length of one side is different from the length of the other side. In addition, the cross-section of the at least one bridge BR may have a trapezoidal shape having a predetermined angle θ. In addition, the cross-section of the body BD may have a wedge shape having the first angle θ1 and the second angle θ2. The first angle θ1 and the second angle θ2 may be the same as or different from each other.

In one embodiment, the bridges BR are removed after the glass body BD has been adhered to the display device. The bridges BR are used by a tool, such as a computer controlled pick and place machine, to pick up the glass body BD and place it on the top of the selected display device, as shown in FIG. 12. In one embodiment, after the glass body BD is on the display device and properly adhered thereto, such as an adhesive, heat treatment, or the like, the purpose of the bridges BR have been completed and they can be removed. They can be removed by etching, laser cutting, snapping off (breaking), cutting, polishing, milling or other technique. Thus, the final display device having the body BD thereon does not have any bridges BR present when it being provided to the end user or for retail sale. Yet, the bridges, BR, have provided a number of benefits in forming the body BD and in placing it on the display device before they were removed in a final step. In some embodiments, after the bridge BR has been removed, a signature of the removal remains on the body BD, for example, a laser removal mark, a breaking line, a cutting line of the like can be left as a residue on the side wall of the body BD. This signature can be determined in one instance because most of the side wall of the body BD will have a cross-section having angles of the type shown and described with respect to FIG. 11, but, in those locations where the bridge BR was present but has been removed, the sidewall will have a different cross-sectional shape. For example, where the bridge BR has been removed, the cross-section shape of the side wall might be vertical, it might have roughened side from being snapped or cut, it might have polished shape. Of course, it is not required to remove the bridges BR after the body BD has been placed on the display device, but this is permitted if desired as part of the final manufacturing process steps of the display device.

Other descriptions of the ultra-thin glass 1400 are the same as that described above.

It can be understood by those skilled in the art that the embodiments can be embodied in other specific forms without departing from its spirit or essential characteristics. Therefore, the foregoing embodiments and advantages are merely exemplary and are not to be construed as limiting the present invention. It can be understood by those skilled in the art that the embodiments can be embodied in other specific forms without departing from its spirit or essential characteristics. Therefore, the foregoing embodiments and advantages are merely exemplary and are not to be construed as limiting the present invention. All modifications, alternatives, and variations derived from the scope and the meaning of the scope of the claims and equivalents of the claims should be construed as being included in the scopes of the embodiments. The various embodiments described above can be combined to provide further embodiments.

All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for manufacturing ultra-thin glass, the method comprising:
    patterning a plurality of display cells on a first glass substrate;
    patterning a dummy area adjacent to the display cells on the first glass substrate;
    forming a plurality of cutting lines, including each of the plurality of cutting lines defining each of the plurality of display cells, each of the plurality of cutting lines having a closed-loop shape surrounding each of the plurality of display cells and the plurality of cutting lines comprising a plurality of patterns arranged in the closed-loop shape and spaced apart from each other;
    forming a protective film on the first glass substrate;
    forming a plurality of through-holes at the plurality of patterns of the plurality of cutting lines, including forming a plurality of bridges between the plurality of through-holes, each of the plurality of bridges including a glass member that extends from one through hole to another through hole of the plurality of through holes; and cutting the plurality of bridges, including separating each of the plurality of display cells from each other and forming portions of the plurality of bridges that protrude from at least one side of each of the plurality of display cells.

2. The method of claim 1, wherein the forming the protective film on the first glass substate comprises:
laminating an acid-resistant film on at least a portion of the dummy area of the first glass substrate or coating or depositing an acid-resistant solution in at least a portion of the dummy area of the first glass substrate.

3. The method of claim 2, wherein the forming the plurality of through-holes comprises:
etching the first glass substrate,
wherein an area where the protective film is not formed is eroded by the etching of the first glass substrate and has a first thickness after the etching of the first glass substrate, and
wherein another area where the protective film is formed is not eroded and has a second thickness larger than the first thickness after the etching of the first glass substrate.

4. The method of claim 3, wherein the first thickness is 20 um to 100 um, and the second thickness is 70 um to 1.3 mm.

5. The method of claim 1, further comprising strengthening the first glass substrate after the forming the plurality of through-holes.

* * * * *